United States Patent
Whiteley

(10) Patent No.: US 11,848,676 B2
(45) Date of Patent: Dec. 19, 2023

(54) INTERFERENCE REDUCING PASSIVE TRANSMISSION LINE RECEIVER

(71) Applicant: Synopsys, Inc., Mountain View, CA (US)

(72) Inventor: Stephen Whiteley, Sunnyvale, CA (US)

(73) Assignee: Synopsys, Inc., Sunnyvale, CA (US)

( * ) Notice: Subject to any disclaimer, the term of this patent is extended or adjusted under 35 U.S.C. 154(b) by 476 days.

(21) Appl. No.: 17/181,869

(22) Filed: Feb. 22, 2021

(65) Prior Publication Data
US 2023/0145418 A1 May 11, 2023

Related U.S. Application Data

(60) Provisional application No. 62/983,392, filed on Feb. 28, 2020.

(51) Int. Cl.
| | |
|---|---|
| *H03M 1/60* | (2006.01) |
| *H03K 3/38* | (2006.01) |
| *G06N 10/00* | (2022.01) |
| *H03K 17/92* | (2006.01) |
| *H03K 19/195* | (2006.01) |
| *H10N 60/12* | (2023.01) |
| *G01R 33/035* | (2006.01) |

(52) U.S. Cl.
CPC ............... *H03K 3/38* (2013.01); *G06N 10/00* (2019.01); *H03K 17/92* (2013.01); *G01R 33/035* (2013.01); *H03K 19/195* (2013.01); *H03K 19/1954* (2013.01); *H10N 60/12* (2023.02)

(58) Field of Classification Search
CPC ...... G01R 33/035; H03K 19/195; H03K 3/38; H03K 19/1954; H10N 60/12; H01L 39/22
See application file for complete search history.

(56) References Cited

U.S. PATENT DOCUMENTS 11,641,194 B1 * 5/2023 Whiteley ............... H10N 60/12
327/199

* cited by examiner

*Primary Examiner* — Joseph J Lauture
(74) *Attorney, Agent, or Firm* — JAQUEZ LAND GREENHAUS & MCFARLAND LLP; Bruce W. Greenhaus, Esq.

(57) ABSTRACT

The present disclosure relates to improved electronic structures for propagating logic states between superconducting digital logic gates using a three-junction interferometer in a receiver circuit to reduce reflecting signals that otherwise result in distortions in the signals being transmitted between the gates. Other improved electronic structures comprise passive transmission lines (PTLs) with transmission line matching circuitry that has previously been avoided. The matching circuitry minimizes generation and propagation of spurious pulses emitted by Josephson junctions used in the digital logic gates.

14 Claims, 13 Drawing Sheets

INTERFERENCE REDUCING PASSIVE TRANSMISSION LINE RECEIVER

CROSS-REFERENCE TO RELATED APPLICATIONS—CLAIM OF PRIORITY

The present application claims priority to U.S. Provisional Application No. 62/983,392, filed Feb. 28, 2020, entitled "Interference-Reducing Passive Transmission Line Receiver", which is herein incorporated by reference in its entirety.

GOVERNMENT LICENSE RIGHTS

This invention was made with government support under W911NF-17-9-0001 awarded by the Intelligence Advanced Research Projects Activity (IARPA) agency. The government has certain rights in the invention.

TECHNICAL FIELD

This disclosure relates to electronic circuits in general, and more particularly to Josephson junction circuits and transmission lines.

BACKGROUND

Superconducting circuitry based on Josephson junctions is used to implement digital logic systems. Josephson junctions are typically a circuit element comprising two superconducting electrodes separated, for example, by a thin insulating tunnel barrier, which can support a current that flows indefinitely without any voltage applied. Although the technology has its challenges, one of the major benefits is greatly reduced power consumption relative semiconductor technologies and digital logic circuits. This benefit is realized, even though systems employing Josephson junction circuit elements must be operated at temperatures close to absolute zero. The possibility of realizing this benefit has resulted in a significant amount of interest in Josephson technology. One example of a program that is attempting to take advantage of this benefit is the federal SuperTools program, in which Synopsys, Inc. of Mountain View, California plays a leading role.

SUMMARY

Embodiments of a method and apparatus are disclosed that operate in a manner that reduces data errors caused by spurious pulses that are generated as a consequence of a combination of particular clock frequencies and line lengths used in circuits with passive transmission lines (PTLs) and PTL driver circuits that emits single flux quantum (SFQ) pulses into the PTL. Also disclosed is an electronic structure for propagating logic states between superconducting digital logic gates. The structure comprises a PTL and transmission line matching circuitry that minimizes the generation and propagation of spurious pulses emitted by Josephson junctions used in the digital logic gates. In some of the embodiments disclosed herein, a new receiver circuit is used that isolates the SFQ-generating junction from the PTL. The PTL terminates into an inductor instead of a Josephson junction. A three-junction interferometer configuration is used for amplification and isolation. With some disclosed embodiments of the receiver circuit, a significant portion of a counter-propagating interference signal that otherwise results is eliminated. What remains is a low-amplitude damped ringing, which dissipates rapidly. This remainder has a far smaller effect than the larger pulse signal generated by conventional receivers resulting in an improved receiver having improved reception and overall performance.

In other embodiments disclosed herein, a conventional receiver is used, but a PTL is terminated with a matching resistance at the driver end. In some such embodiments, the driver is designed to be insensitive to the counter-propagating pulses. The counter propagating pulses will disappear without ill effect as a result of a matched termination. Such embodiments eliminate the negative effect of clock frequency and line length dependent data errors from spurious pulses in the transmission lines.

This summary and the abstract do not limit the breath, scope or applicability of the claimed invention, but rather the invention as claimed herein is limited only by the language of the claims themselves.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

Figure 1:
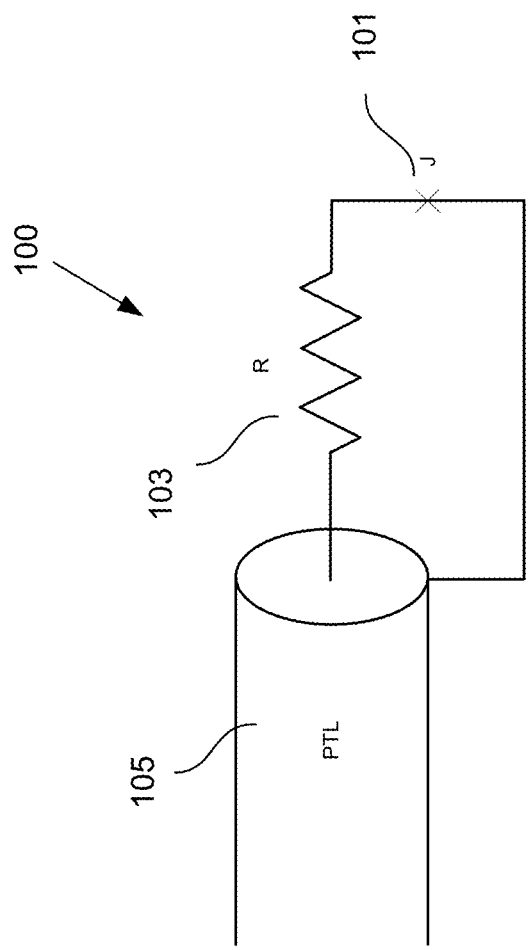
FIG. 1 shows a simplified schematic of a conventional PTL driver or receiver.

In the figures, reference signs can be omitted as is consistent with accepted engineering practice; however, a skilled person will understand that the illustrated components when viewed in the context of the figures as a whole, of the accompanying writings about such figures, and of the embodiments of the claimed inventions.

DETAILED DESCRIPTION

Josephson junctions are found to be useful in digital logic circuits that rely on the quantum mechanical quantization of magnetic flux. The quantum mechanical quantization of magnetic flux results in magnetic flux being quantized as it threads a hole or a loop in a superconductor. One use of quantum mechanical quantization of magnetic flux called single flux quantum (SFQ) logic, is realized in logic circuits. Though SFQ logic itself has numerous variations, all such variations make use of flux storage and transmission, which is affected by pulses emitted by a Josephson junction that is typically shunted by a resistance in SFQ circuits. When a Josephson junction emits a voltage pulse, it induces a single quantum of magnetic flux into a connected inductor. This type of pulse is known as an "SFQ pulse". Rapid SFQ (RSFQ) devices can achieve pulse widths as narrow as a few picoseconds.

Logic circuits can be generated in which logic states propagate from one gate to another through the propagation of such pulses. Historically, SFQ pulses were transmitted via a Josephson transmission line (JTLs) consisting of small series inductors with a Josephson junction connected to ground at the intersections. The inductors tend to have rather small inductance values, enabling a relatively long Josephson transmission line having many junctions. Each junction is biased, therefore consuming current and dissipating power. Further, each junction presents a delay in signal propagation. However, such lines maintain the essential characteristics of an SFQ pulse with high reliability.

In a very large scale integrated circuit (VLSI) environment, the use of JTLs for interconnecting gates is not an option, due to a large and variable delay through the JTLs and further due to the lack of a viable automated routing design tool. One alternative is to use passive transmission lines (PTLs), including stripline structures. Superconductive stripline structures have extremely low power loss. However, PTLs require a driver circuit to drive the line with a non-SFQ voltage pulse and then convert the received pulse back into an SFQ pulse at a receiver.

Nonetheless, one benefit of using PTL interconnections is that designers can use existing routing tools that are provided within existing Electronic Design Automation (EDA) systems for the designing PTL circuits. Such tools are essential for managing the many design trade-offs and overcoming the technical challenges inherent in designing circuits using PTLs.

Some of the challenges that arise in the design of circuits using PTLs are due to the fact that a PTL driver circuit invariably consists of a junction that emits SFQ pulses into the transmission line. This creates two problems.

The first problem involves balancing a trade-off between wiring density and transmission line width. To enable high wiring densities, it is desirable to use narrow transmission lines. However, as the transmission line becomes narrower, the characteristic impedance of that line increases. A higher impedance results in less pulse energy being injected into the line, due in part to the limited amplitude of the SFQ pulse. With less pulse energy, it may be necessary to either provide a receiver with higher-sensitivity or reduce the noise immunity of the receiver, or both. For line widths ranging from one to several microns, an approximate impedance range for a PTL is from a few ohms to 20 ohms. Such line widths are considered quite large for CMOS integrated circuits and can increase the difficulties of designing such a CMOS integrated circuit.

The second problem caused by a junction that emits SFQ pulses into a transmission line is the generation and propagation of spurious pulses that can cause subsequent data errors. One reason such spurious pulses are generated and propagated is the fact that a Josephson PTL receiver, in its simplest form, consists of a single junction biased near the threshold of the junction. While the pulse from the transmission line has sufficient energy to raise the junction above its threshold, and thus cause an SFQ pulse to be generated (as is desired to generate an output), the same pulse will also propagate backwards along the transmission line toward the driver. Over time, this backwards propagating pulse will die away after reflecting from the ends of the transmission lines. However, if these reflections coincide with a subsequent data pulse, mis-triggering can result, causing a data error. "Tuning" the clock frequency and transmission line delays can avoid having the reflection coincide with the data pulse, however this is difficult to achieve in an LSI environment and reduces the chip flexibility by constraining the clock frequency. That is, tuning the lengths of the interconnects (altering the lengths to suit the application) to avoid certain timing windows when used with an assumed clock frequency would probably not work in densely wired layouts, since it is very difficult to change the physical layout in order to tune (i.e., modify) the transmission line lengths.

In order to overcome some of these problems, it would be desirable to reduce or eliminate the need to make tradeoffs between circuit density, line widths and impedances of circuits that use both PTLs and associated PTL driver circuits that emit SFQ pulses into the PTL. In addition, it would be desirable to reduce the potential for data errors due to spurious pulses without having to tune clock frequencies and transmission line delays in such circuits.

All of the circuits disclosed herein can be designed, simulated and optimized with electronic circuit design tools that are either commercially available or that can be attained through open source resources. These tools make use of libraries of device and circuit primitives developed for general circuit design and optimization. Resulting circuit designs can then be used to fabricate devices at an appropriate foundry. The concepts and general implementation of the circuits presented here are independent of the specific library and foundry employed. Accordingly, the circuits disclosed herein are improved circuits with respect to circuits in which single flux quantum (SFQ) pulses were propagated between gates of such a circuit using a series of Josephson junctions, making the use of such electronic circuit design tools impossible.

FIG. 1 shows a simplified view of a conventional passive transmission line (PTL) receiver 100. In the case of a driver, one would flip the diagram left-to-right, so that a signal would be seen originating as an SFQ pulse across a Josephson junction 101. The generated pulse is applied to a PTL 105 through a resistor 103. In the case of the receiver 100, a pulse from the PTL 105 is applied to a biased Josephson junction 101 through the resistor 103, inducing an SFQ pulse from the junction 101. In some embodiments, the resistor 103 has a resistance of 0Ω (i.e., a short-circuit).

"Resonance" effects in the system can result in data errors that occur for very specific transmission line delays (or physical line lengths) when operating at a particular clock frequency.

Figure 2:
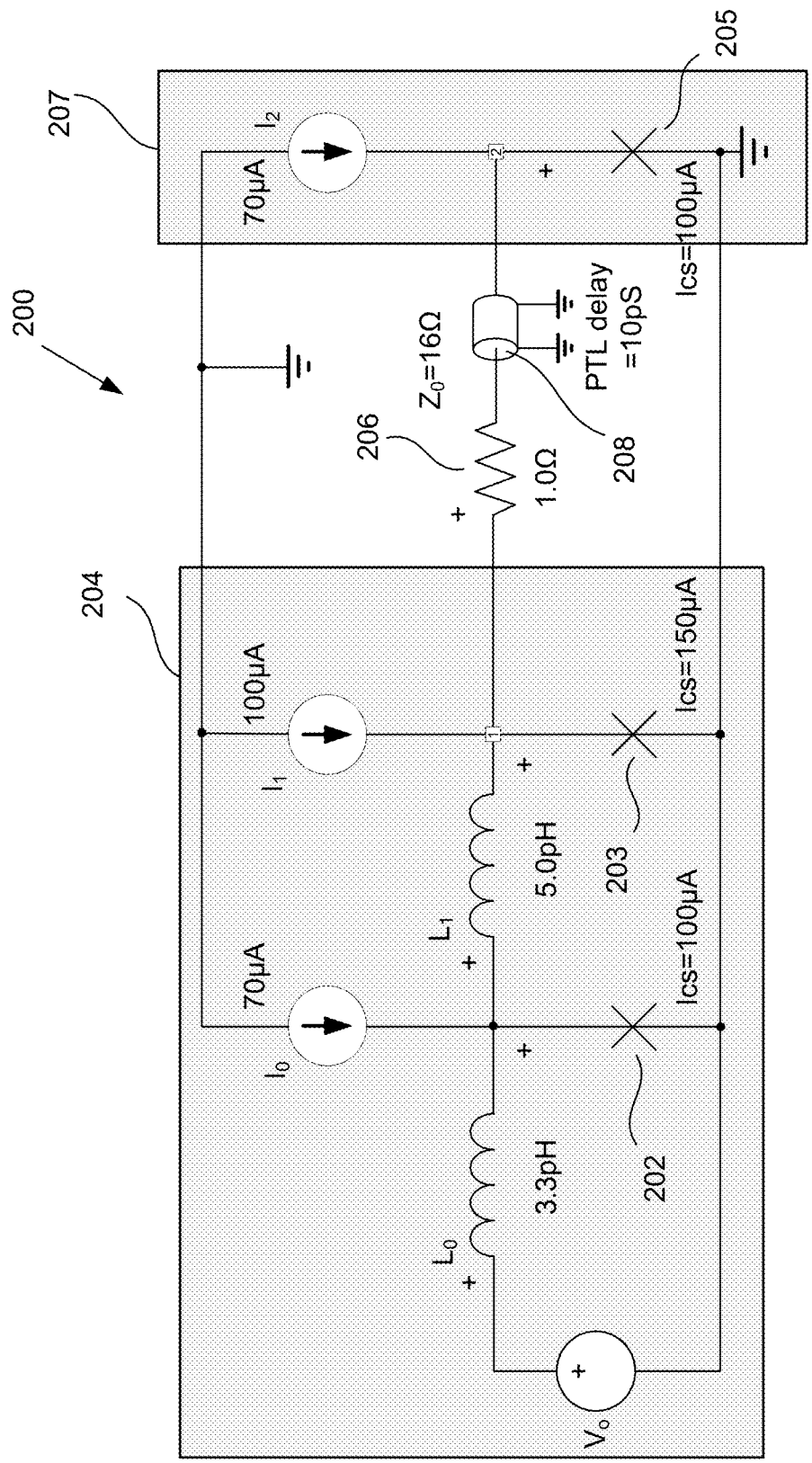
FIG. 2 shows a simplified schematic in accordance with some embodiments of the circuit depicted in FIG. 1.

FIG. 2 shows an example of a circuit 200 in which two Josephson junctions 202, 203 are used within a PTL driver 204. A third Josephson junction 205 is used in a receiver 207. Some component values are provided as an example and will vary in other embodiments of the disclosed circuit. A PTL 208 between the PTL driver 204 and the receiver 207 has a delay of 10 picoseconds. A resistor 206 in series with the PTL 208 has a value of 1 ohm in the example shown and is used to break the superconducting loop. In this example, the value of the resistor 206 is much lower than the 16 ohm impedance of the PTL 208.

A pulse from the PTL driver 204 will enter the PTL 208, propagate left to right, and be applied to the receiver junction 205. The receiver junction 205 will switch as a consequence, emitting an SFQ pulse. This pulse will enter the PTL 208 on the right and propagate right to left along the PTL 208. As the pulse reaches the end of the PTL 208, it will be reflected and become a forward propagating pulse with an amplitude that is reduced by the reflection coefficient $(R-Z)/(R+Z)$, where R is the value of the resistor 206 and Z is the impedance of PTL 208. For the situation in FIG. 2, the reflection coefficient is a negative value close to one. If the resulting reflected pulse is coincident with a data pulse, the two will at least partially cancel, producing a data error. This is the basis of the "resonance" effect. In some embodiments of the disclosed circuit, the impedance of the resistor 206 is chosen to be the same as the impedance of the PTL 208. This results in the reflection coefficient being zero. Therefore, there is no reflected pulse and the "resonance" effect is eliminated.

The resonant affect occurs infrequently, because the pulse widths are narrow, resulting in a low probability that the timing will result in cancellation. However, in VLSI circuits, where there may be thousands to millions of such transmission lines, the joint probability of a resulting cancellation is much greater. Because simple circuits typically work without significant errors, designers are not aware of the effect.

Figure 3:
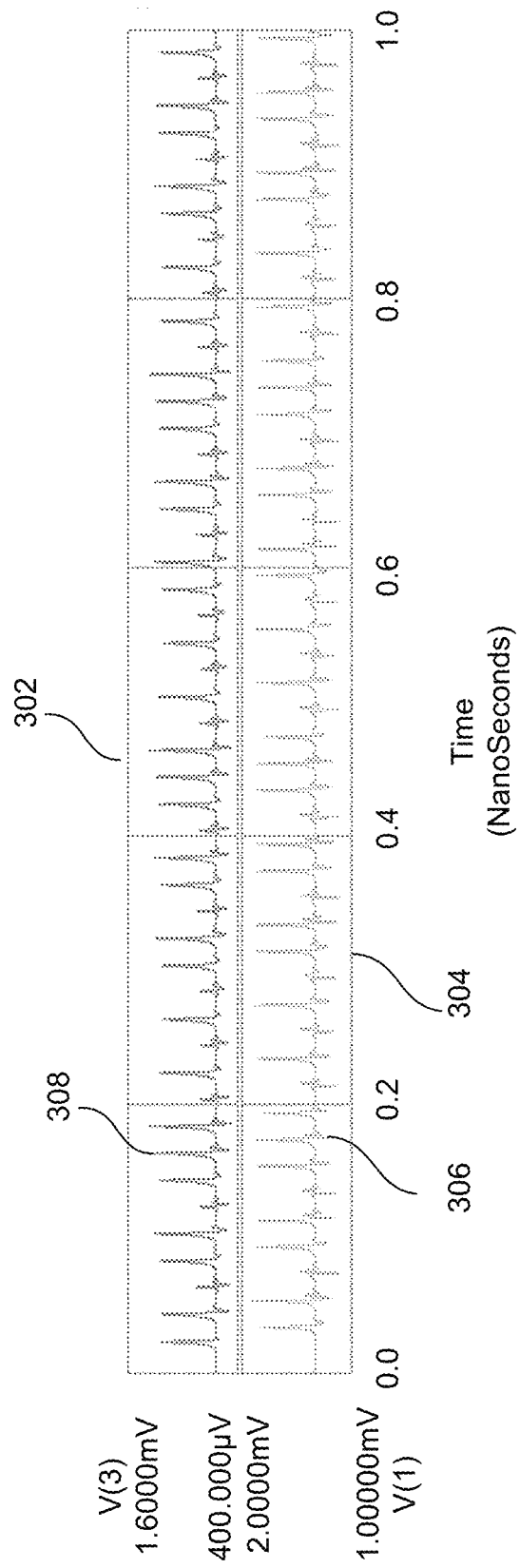
FIG. 3 shows an example of an input signal and a resulting output signal when the input signal is applied to the circuit of FIG. 2 with a PTL having a transmission delay of 10 pS.

FIG. 3 shows an example of an input signal 302 and the resulting output signal 304 when the input signal 302 is applied to the circuit 200. The signals 302, 304 are generated from a simulation in which the PTL 208 has an impedance of 16.0 ohms and there is a 10 picosecond delay through the PTL 208. The output signal 304 is essentially a faithful representation of the input signal 302, although delayed by the transmission line delay of the PTL. In particular, note that the series of 3 pulses that include the pulse 306 just before the 0.2 ns mark is nearly identical to the series of 3 pulses that include the pulse 308 in the input signal 302. Thus, it appears that the circuit behaves in an acceptable manner even though reflections are occurring, since the reflections seem to be occurring at times that result in a minimal distortion to the output signal.

Figure 4:
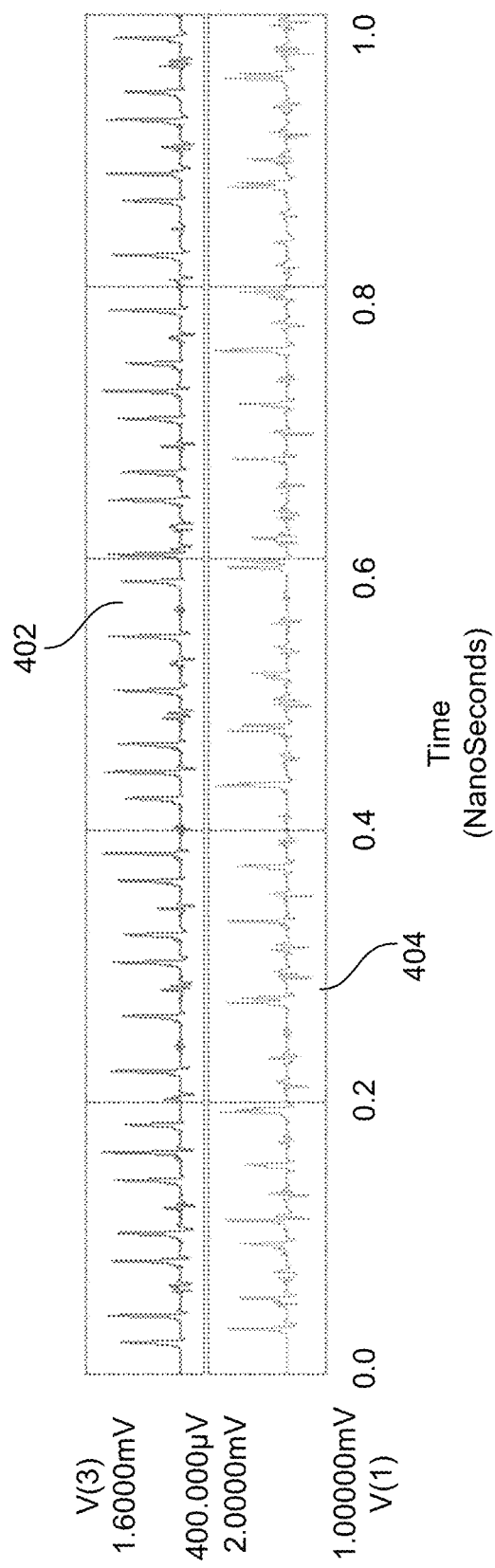
FIG. 4 shows an example of an input signal and a resulting output signal when applied to the circuit shown in FIG. 2 with a PTL having a transmission delay of 9 pS.

FIG. 4 shows an illustration of an input signal 402 and an output signal 404 for the same circuit in FIG. 2. However, the time delay through the PTL 208 is reduced from 10 ps to 9 ps. As a result of just a 1 picosecond difference, the output signal 404 is significantly distorted, with some of the output data pulses, such as the pulse 306 that was seen in the output signal of FIG. 3, missing from the output signal 404. The missing pulses reflect the distortion resulting from the resonance effect at certain clock frequencies and with certain transmission line delays. The resonance effect causes backward propagating pulses to be reflected from the Josephson junction 205 of the receiver 207 with a polarity inversion with regard to the driver side, resulting in some of the pulses being cancelled at the receiver 207, as can be seen in the output signal 404.

To analyze the signals in the PTL 208, one can conceptually replace each of the Josephson junctions 202, 203, 204 with an ideal voltage source whose voltage is precisely the same as that which would be seen across the respective Josephson junctions. The signal found in the PTL 208 is then a superposition of the signals generated by the voltage sources and the reflections induced at the ends of the PTL 208.

Ideally, by matching the resistance at both ends of the PTL 208, reflection-free transmission can be achieved. However, in practice this is not done because it is considered impractical due to the amount of signal power that would be lost in a resistor required to create the resistance match. This is because the amplitude of the pulses launched onto the PTL 208 is limited by the amplitude produced by the Josephson junctions, which is characteristic of the junctions for a given manufacturing technology. For example, in the fabrication process for the Lincoln Laboratory SFQ5ee Josephson circuit (as used to model particular characteristics of a Josephson junction in the federal SuperTools program), the amplitude produced is about 0.69 mV. The peak current of the pulse in the line is the value of the amplitude produced by the Josephson junction divided by the sum $(R+Z)$ of the resistor 206 and the characteristic impedance of the PTL 208. In a practical design, the characteristic impedance Z is made to be as high as possible, in order to have the line width be as narrow as possible to maximize the wiring density. Accordingly, twice as much current is obtained in the pulse by substantially reducing the value R of the resistor 206 (e.g., setting R=0 Ohms).

It should further be noted that even if the impedances at receiver end of the PTL 208 is matched, there is still a spurious pulse generated when the receiver junction 205 switches in response to a received pulse. That is because the receiver 207 becomes a generator, launching a counter-propagating pulse into the PTL 208. The counter-propagating pulse will be reflected as a negative forward-propagating pulse due to a reflection at the assumed unmatched driver end of the PTL 208. In the typical case, the driver end of the PTL 208 is driven directly by the driver junction 203 and the reflection coefficient is −1, as determined from the formula for the reflection coefficient $(R-Z)/(R+Z)$ when the resistance R=0 for the driving resistor 206. If the negative parasitic pulse is precisely coincident with a data pulse, the two will cancel and a data error will result (the receiver will not detect any pulse).

Figure 5:
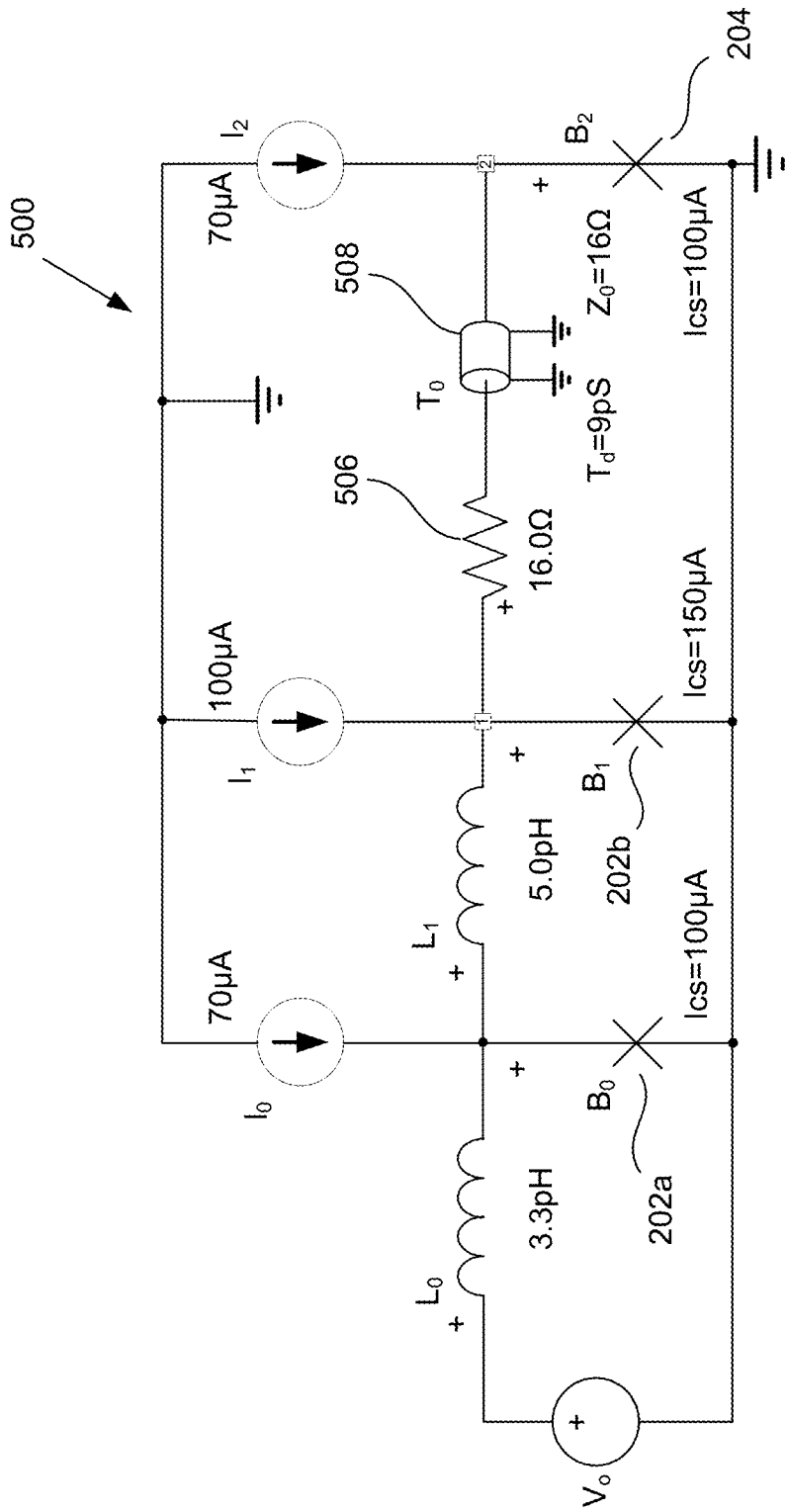
FIG. 5 shows a simplified schematic in accordance with some embodiments of the circuit depicted in FIG. 7.

FIG. 5 shows the same circuit topology as in FIG. 2, however the resistor 506 has a value equal to the impedance of the PTL 508, which is 16.0 ohms in this example. In one example, the delay of the PTL 508 is kept at 9.0 picoseconds, which is known to be a value susceptible to the resonance effect.

Figure 6:
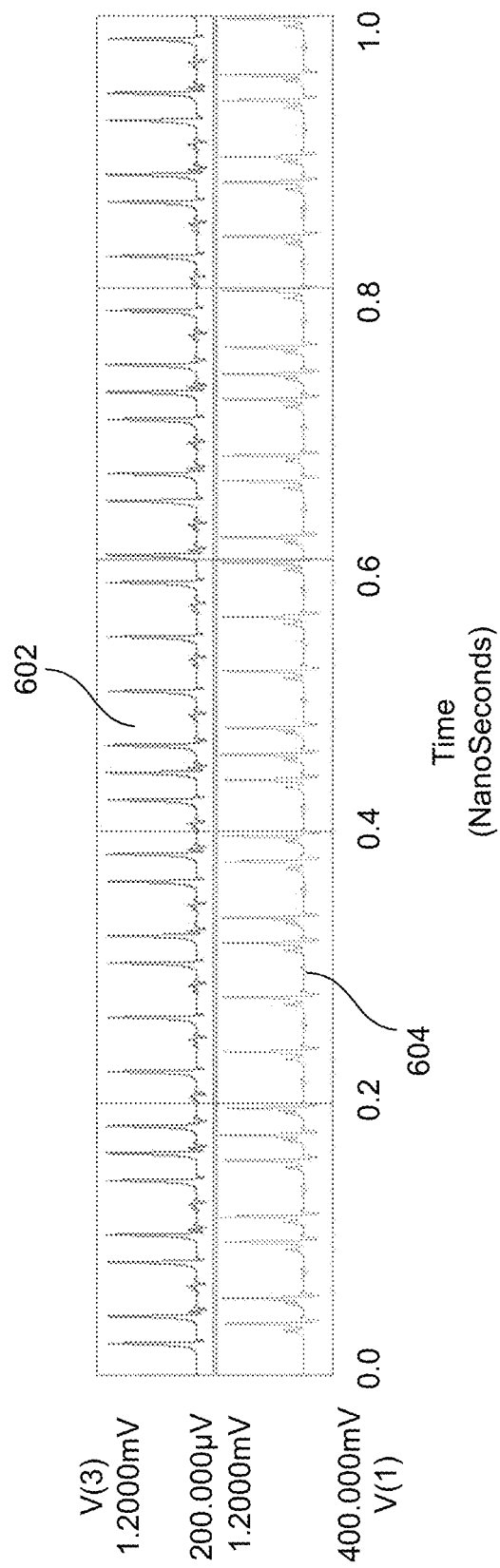
FIG. 6 shows an example of an input and a resulting output signal when applied to the circuit depicted in FIG. 5.

FIG. 6 shows a simulated input signal 602 and output signal 604. Compared to the output signal 404, the circuit with the values are shown in FIG. 5 produces an output signal 604 with minimal detectable distortion. That is, the output pulse train of the output signal 604 is a faithful delayed representation of the pulse train at the input signal 602. Accordingly, matching the impedance of the PTL 508 to the impedance of the resistor 506 successful mitigates the "resonance" effect.

In other embodiments disclosed herein, receiver circuits are disclosed which reduced the effects of the counter-propagating signals by providing some degree of input/output isolation.

Figure 7:
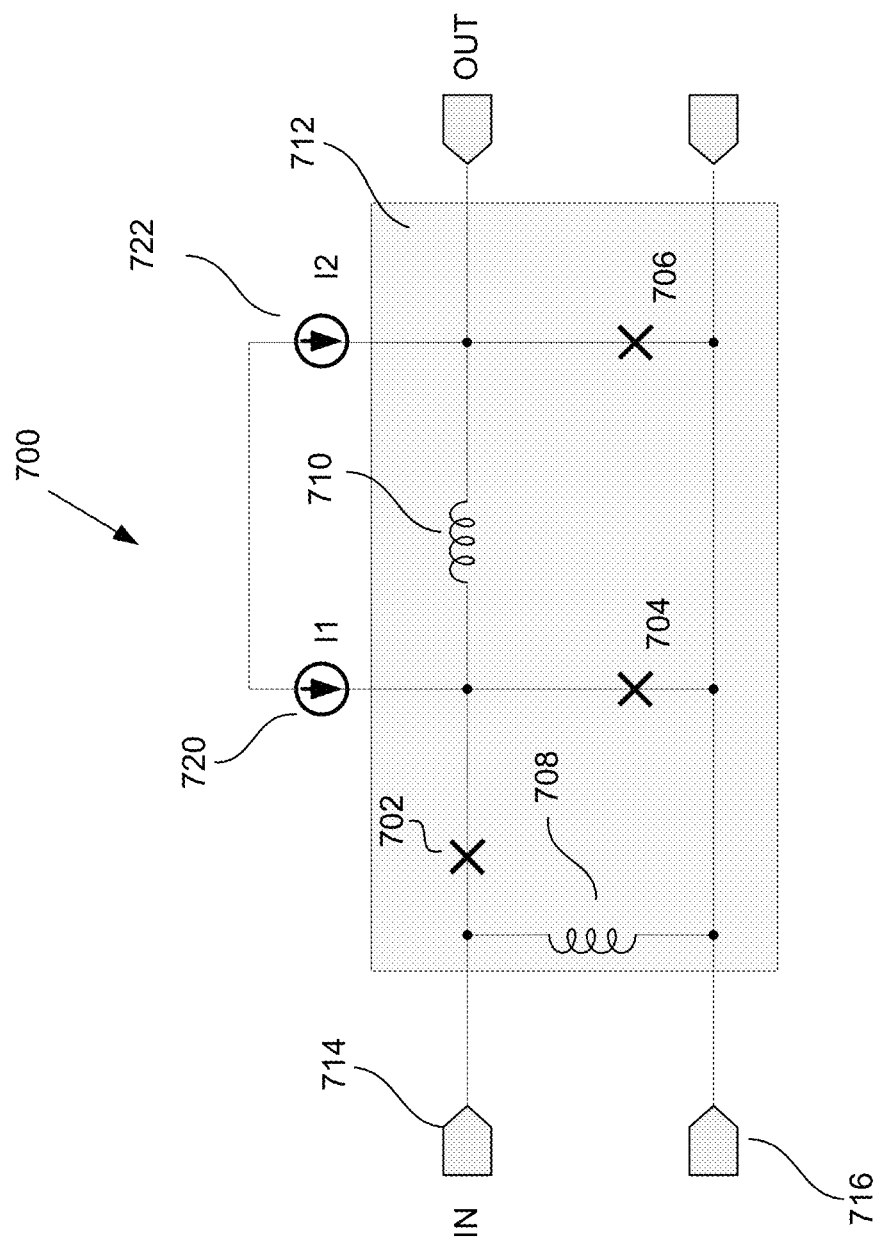
FIG. 7 shows a simplified schematic of a receiver circuit in accordance with some embodiments of the method and apparatus disclosed herein.

FIG. 7 shows a receiver circuit 700 using a three junction interferometer 712. The three Josephson junctions 702, 704, 706 together with two associated inductors 708, 710, form the three-junction interferometer 712. The interferometer 712 is sensitive to current injected into an input terminal 714. The critical current of a first Josephson junction 702 is twice that of a second and a third Josephson junction 704, 706. Two bias current sources 720, 722 are provided. The current injected through the input terminal 714 will cause the second Josephson junction 704 to switch, which in turn causes the first and third Josephson junctions 702, 706 to switch. The switching of the first Josephson junction 702 isolates the input terminal 714 from the switching of the third Josephson junction 706. The inductor 708 coupled between an input terminal 714 and a reference potential terminal 716 coupled to a reference potential, such as ground, serves as a sink for residual current through the first Josephson junction 702, preventing the formation of an interference signal that might otherwise be emitted through the input terminal 714 back into a PTL (see PTL 208 in FIG. 8C) coupled to the input terminal 714. The present circuit 700 reduces the amplitude of interference signals that would otherwise be produced to the point of being negligible.

Figure 8A:
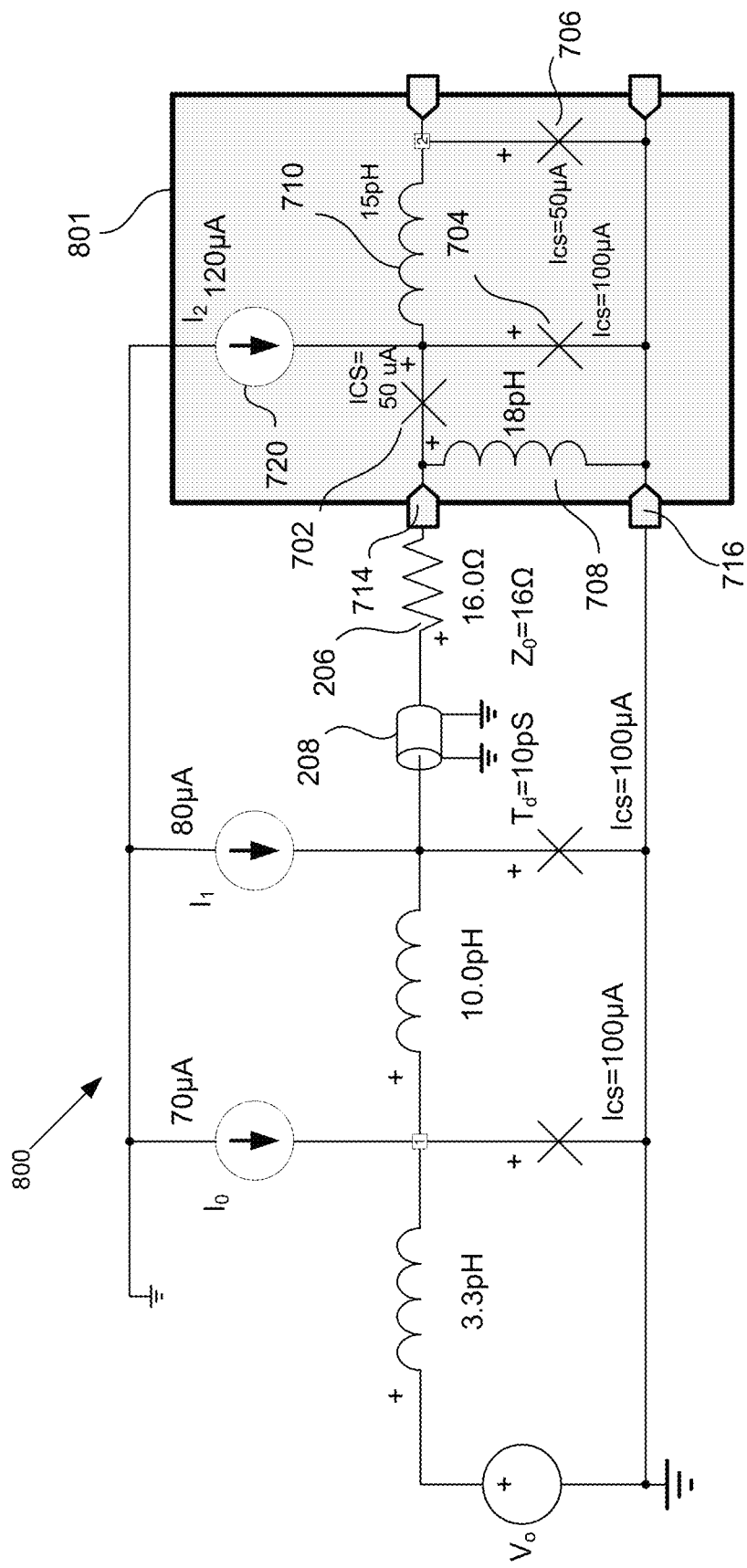
FIG. 8A is a simplified schematic of an example of a circuit 800 that comprises the receiver circuit shown in FIG. 6.

FIG. 8A is a simplified schematic of a circuit 800 that comprises the receiver circuit 801 similar to the circuit 700. It should be noted that in the particular embodiment of the receiver circuit 801, no source of bias current 722 is needed. In the particular circuit 801, the Josephson junction 706 has a critical current that is much lower than the Josephson junction 704 and so can operate as desired without the bias current source 722. However, in other embodiments (such as the embodiment shown in FIG. 8C) it might be necessary or desirable to provide the bias current source 722.

Figure 8B:
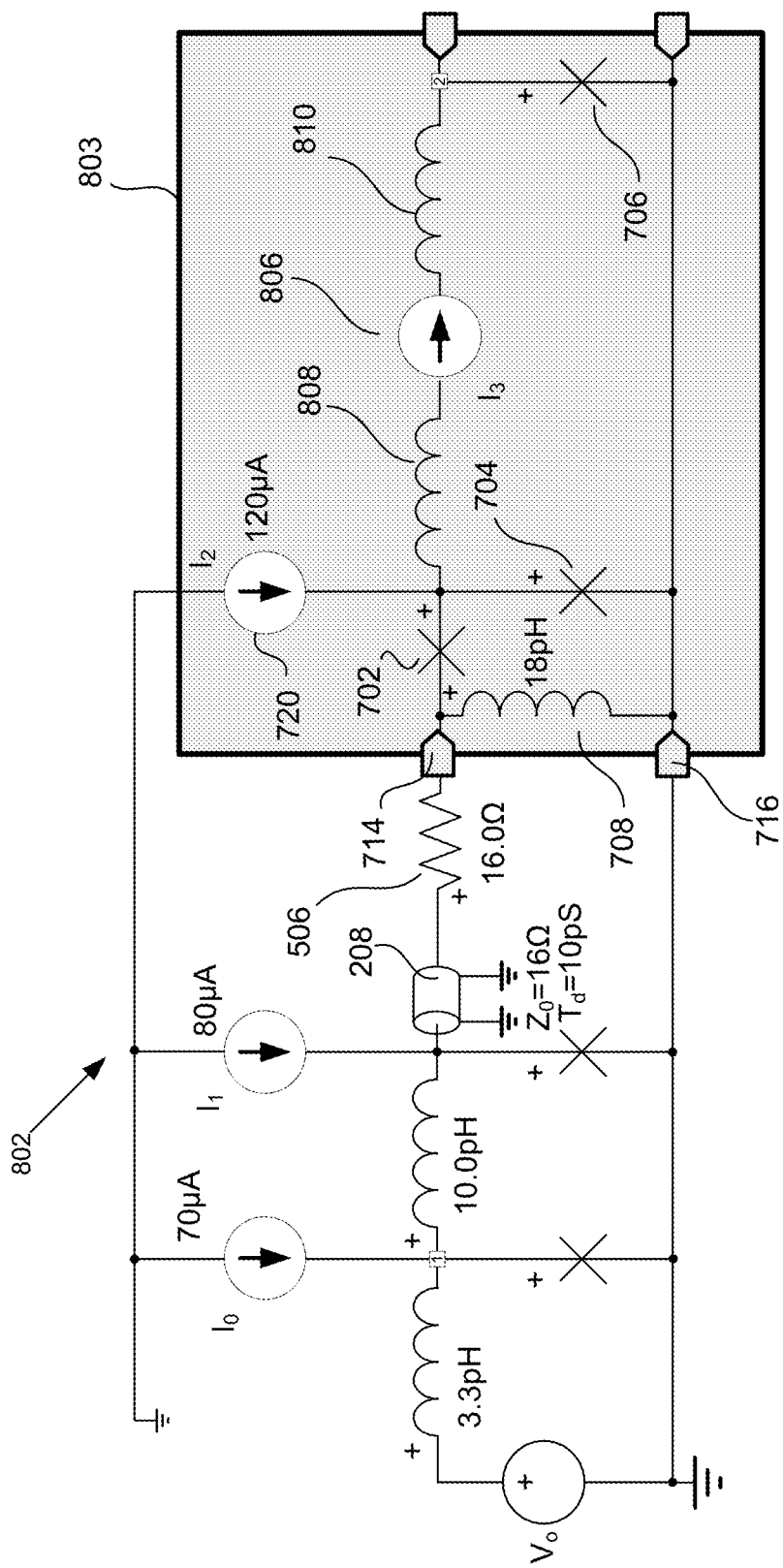
FIG. 8B is a simplified schematic of an embodiment in which an inductor of the circuit shown in FIG. 8A is split into a first and a second independent inductor and a third bias current source to the receiver is provided between the first and the second independent inductor.

FIG. 8B is a simplified schematic for a circuit 802 used in other embodiments in which the inductor 710 may be split into two independent inductors 808, 810 and a bias current source 806 provided between the inductor 808 and the inductor 810. Specific values for the components are provided as an example of an embodiment of the circuit 800. However, other values are to be used in other embodiments designed for particular implementations. In this example, a 16 Ohm resistance 506 is provided at the receiver side of a PTL 208 ahead of the receiver 803 to provide an impedance match to the 16 Ohm characteristic impedance of the PTL 208. With the circuit element values as specified in FIG. 8A, the PTL 208 is matched on the receiver side. The inductance 708 to ground (in this example, 18 picoHenries) reduces the transient signal that is otherwise launched back into the PTL 208 when the three receiver junctions 804, 806, 808 switch.

Figure 8C:
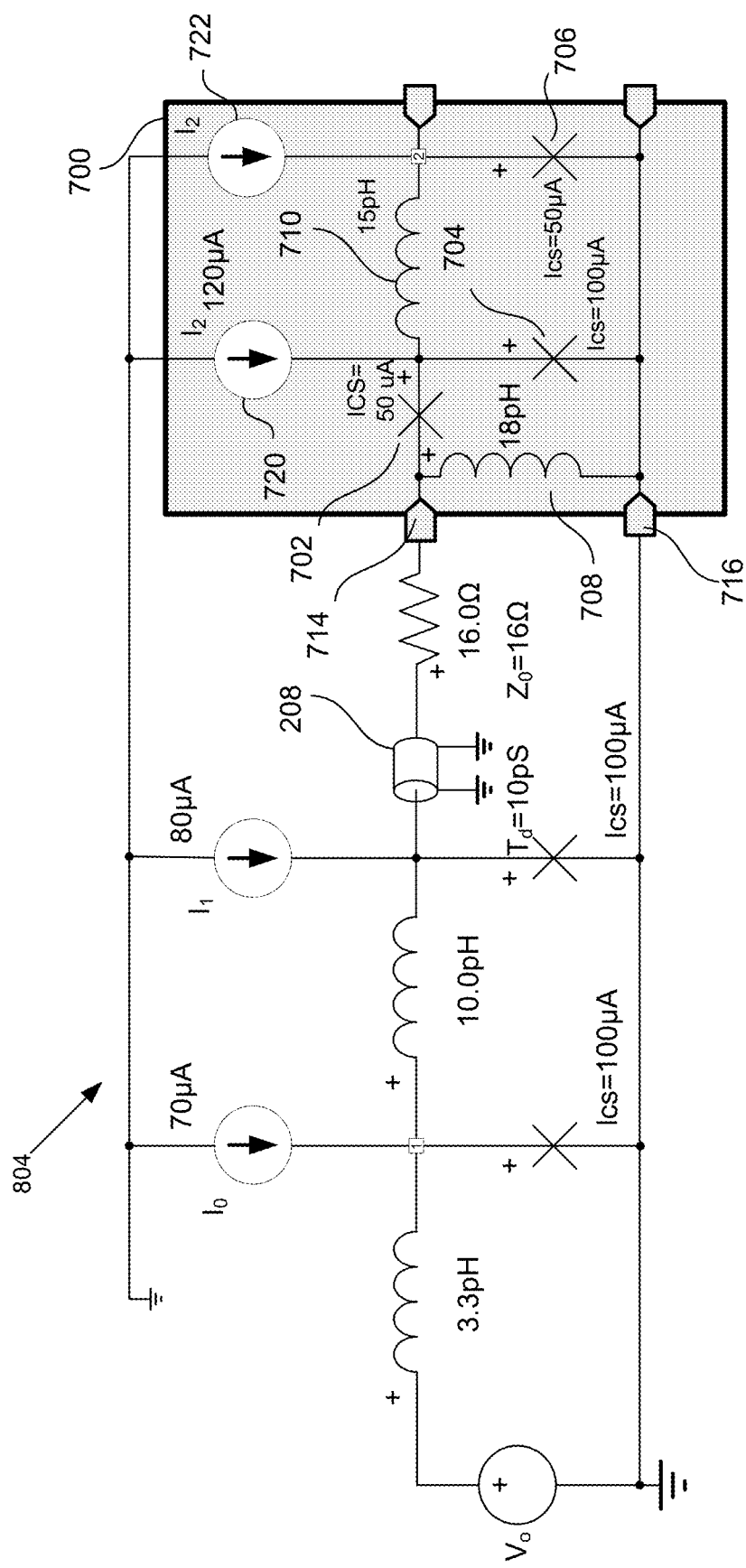
FIG. 8C shows a circuit used in other embodiments in which the circuit of FIG. 7 is used.

FIG. 8C shows a circuit 804 used in other embodiments in which the circuit 700 is used. As noted above with respect to FIG. 7, the receiver 700 has three Josephson junctions 702, 704, 706, two inductors 708, 710, two bias current sources 720, 722, an input terminal 714, and a reference potential terminal 716.

Figure 8D:
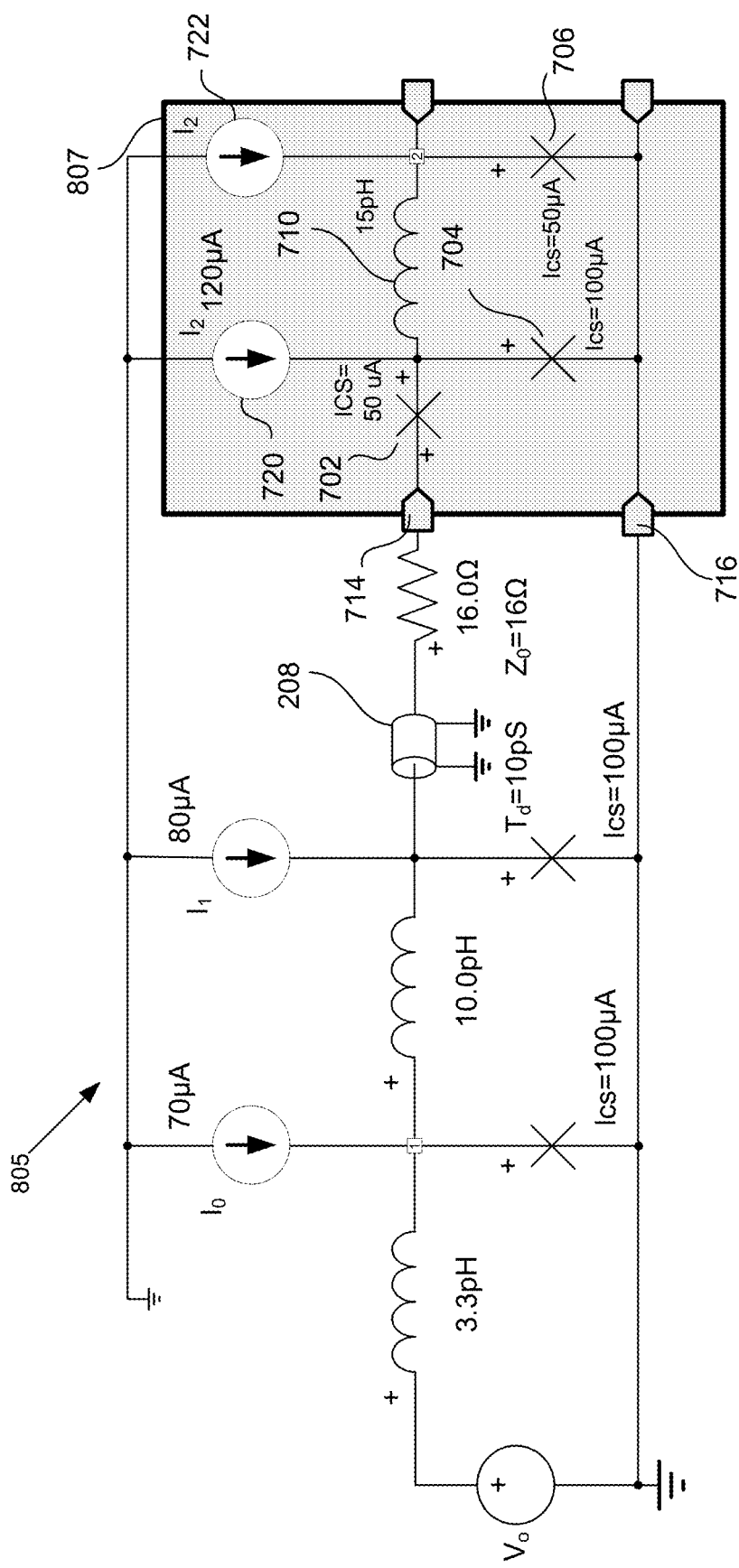
FIG. 8D shows a circuit used in other embodiments, in which a receiver circuit similar to the receiver circuit of FIG. 7, but without the inductor between the input terminal of the receiver and the reference potential terminal of the receiver.

FIG. 8D shows a circuit 805 used in other embodiments, in which a circuit 807 is used. The circuit 807 is similar to the circuit 700, however the inductance between the input terminal 714 and the reference potential terminal 716 is absent.

Figure 9:
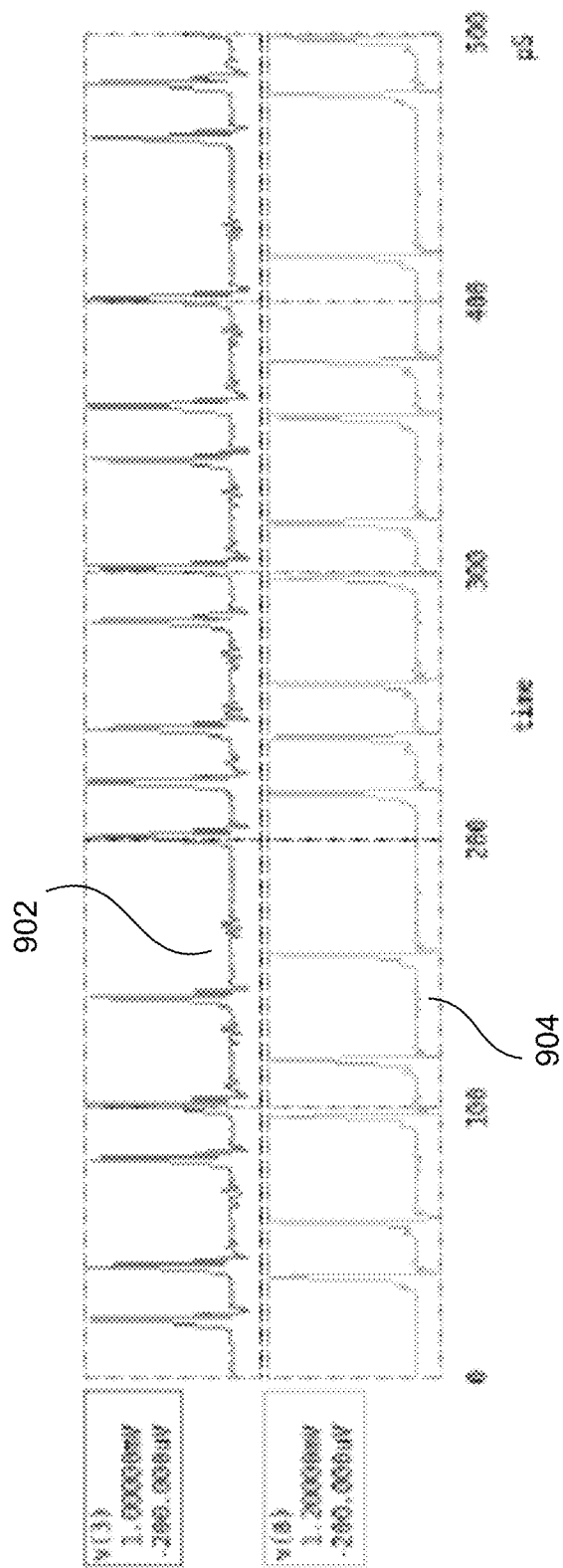
FIG. 9 shows an example of a signal transmitted to the receiver of the circuit of FIG. 8.

FIG. 9 shows an input signal 902 and an output signal 904 for the circuit 800. The output signal 904 has minimal distortion (i.e., is a faithful representation of the input signal 902, delayed by the PTL 208). For other values of transmission line delay (different lengths), there is essentially no "resonance" effect. The new receiver essentially eliminates the resonance by not emitting a large pulse signal back into the PTL 208.

Figure 10:
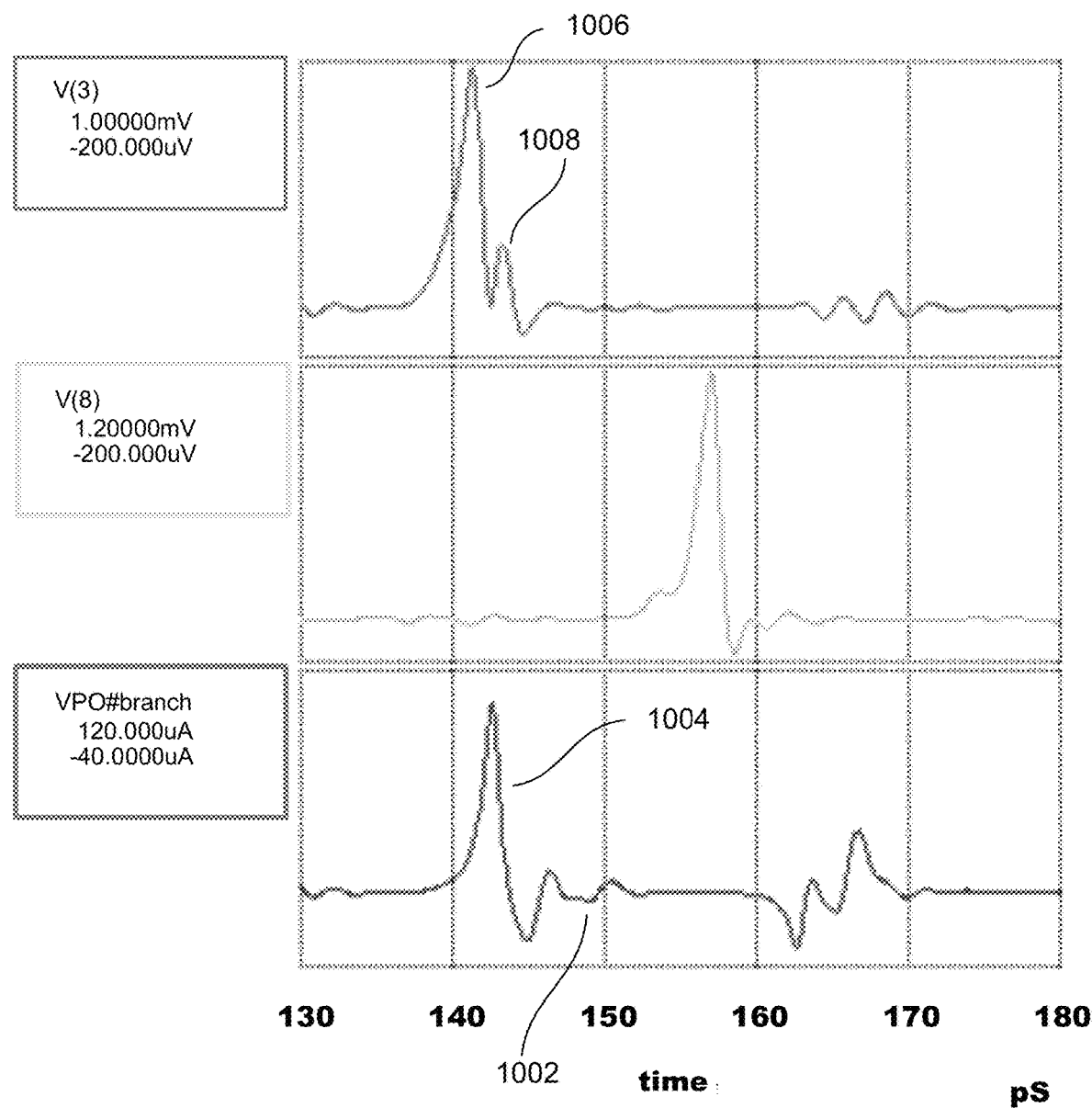
FIG. 10 shows an example of both a current and voltage a signal transmitted to the receiver of the circuit of FIG. 8.

FIG. 10 shows details of signals obtained from the simulation performed with the circuit 800 and element values shown in FIG. 8A. In this case, in addition to input and output pulses 902, 904 illustrated in FIG. 9, the current 1002 that flows into the driver side of the passive PTL 208 is shown. This shows a current pulse 1004 coincident with the voltage pulse 1006 generated by the driver, and at a later time on the same trace, the return from the receiver appears as a small transient signal 1008 when the incident pulse is received. Note that this signal is much smaller than the incident pulse 1006 and is essentially balanced with respect to positive and negative current flow. This is unlikely to cause errors.

Features, structures, functions, or characteristics described herein may be used in any combination of two or more such features, structures, functions or characteristics, irrespective of whether such features, structures, functions or characteristics, or combinations thereof, solve any problems disclosed herein. Furthermore, particular embodiments disclosed are not intended to limit the scope of the Claims of the patent, but rather support such claims.

In view of the Detailed Description, a skilled person will understand that many variations of the disclosed embodiments may be possible and would support the claimed inventions to such.

The disclosed embodiments are neither exhaustive nor limiting of the precise structures claimed. It is intended that the scope of the claimed inventions and embodiments be defined by the following Claims and their equivalents.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

The invention claimed is:

1. A three-junction interferometer, including:
   an input port;
   a reference potential terminal;
   a first Josephson junction having a first and second terminal, the first terminal coupled to the input port;
   a second Josephson junction having a first and second terminal, the first terminal of the second Josephson junction being coupled to the second terminal of the first Josephson junction and the second terminal of the second Josephson junction being coupled to the reference potential terminal;
   a first inductance having a first and second terminal, the first terminal of the first inductance being coupled to the second terminal of the first Josephson junction; and
   a third Josephson junction having a first and second terminal, the first terminal of the third Josephson junction being coupled to the second terminal of the first inductance and the second terminal of the third Josephson junction being coupled to the reference potential terminal.

2. The three-junction interferometer of claim 1, further comprising a second inductance having a first and second terminal, the first terminal of the second inductance coupled to the first terminal of the first Josephson junction and the second terminal of the second inductance coupled to the reference potential terminal.

3. The three-junction interferometer of claim 2, further comprising an impedance matching device having a first and second terminal, the first terminal coupled to the input port and the second terminal configured to receive signals from a transmission line having a characteristic impedance, wherein the impedance of the impedance matching device is matched to the characteristic impedance of the transmission line.

4. The three-junction interferometer of claim 1, further comprising a first current source having a current in port and a current out port, the current in port coupled to the reference potential terminal and the current out port coupled to the first terminal of the second Josephson junction.

5. The three-junction interferometer of claim 4, further comprising a second current source having a current in port and a current out port, the current in port of the second current source coupled to the reference potential terminal and the current out port of the second current source coupled to the first terminal of the third Josephson junction.

6. The three-junction interferometer of claim 1, further comprising an impedance matching device having a first and second terminal, the first terminal coupled to the input port and the second terminal configured to receive signals from a transmission line having a characteristic impedance, wherein the impedance of the impedance matching device is matched to the characteristic impedance of the transmission line.

7. A three-junction interferometer, including:
(a) an input port;
(b) a reference potential terminal;
(c) a first Josephson junction having a first and second terminal, the first terminal coupled to the input port;
(d) a second Josephson junction having a first and second terminal, the first terminal coupled to the second terminal of the first Josephson junction and the second terminal coupled to the reference potential terminal;
(e) a first inductance having a first and second terminal, the first terminal coupled to the second terminal of the first Josephson junction;
(f) a first current source having a current in port and a current out port, the current in port coupled to the second terminal of the second inductance;
(g) a second inductance having a first and second terminal, the first terminal of the second inductance coupled to the first terminal of the current out port of the first current source;
(h) a third Josephson junction having a first and second terminal, the first terminal coupled to the second terminal of the second inductance and the second terminal coupled to the reference potential terminal.

8. The three-junction interferometer of claim 7, further comprising a second current source having a current in port and a current out port, the current in port coupled to the reference potential terminal and the current out port coupled to the second terminal of the first Josephson junction.

9. The three-junction interferometer of claim 7, further comprising an impedance matching device having a first and second terminal, the first terminal of the impedance matching device coupled to the input of the three-junction interferometer and the second terminal of the impedance matching device configured to receive an input signal.

10. A digital logic circuit comprising:
(a) a driver circuit configured to receive a single flux quantum (SFQ) input signal and convert the SFQ input signal into a non-SFQ voltage, the driver circuit comprising:
  (1) a first inductance having a first and second terminal;
  (2) a second inductance having a first and second terminal, the first terminal of the second inductance coupled to the second terminal of the first inductance;
  (3) a drive resistance having a first and second terminal, the first terminal of the drive resistance coupled to the second terminal of the second inductance;
  (4) a first Josephson junction having a first and second terminal, the first terminal of the first Josephson junction coupled to the second terminal of the first inductance, the second terminal of the first Josephson junction coupled to a reference potential; and
  (5) a second Josephson junction having a first and second terminal, the first terminal of the second Josephson junction coupled to the second terminal of the second inductance, the second terminal of the second Josephson junction coupled to a reference potential;
(b) a passive transmission line (PTL) having a driver end and a receiver end, the receiver end coupled to the second terminal of the drive resistance and having an impedance that is matched to the impedance of the drive resistance; and
(c) a receiver comprising:
  (1) a third Josephson junction having a first and second terminal, the first terminal of the third Josephson junction coupled to the receiver end of the PTL and the second terminal of the third Josephson junction coupled to the reference potential.

11. The digital logic circuit of claim 10, wherein the driver circuit further comprises:
(a) a first current source having a current in port and a current out port, the current in port of the first current source coupled to a reference potential, the current out port of the first current source coupled to the first terminal of the first Josephson junction;
(b) a second current source having a current in port and a current out port, the current in port of the second current source coupled to a reference potential, the current out port of the second current source coupled to the first terminal of the second Josephson junction; and
wherein the receiver further comprises:
(a) a third current source having a current in port and a current out port, the current in port of the third current source coupled to a reference potential, the current out port of the third current source coupled to the first terminal of the third Josephson junction.

12. The digital logic circuit of claim 10, the receiver further comprising:
(a) a fourth Josephson junction having a first and second terminal, the first terminal of the fourth Josephson junction coupled to the second terminal of the drive resistance and the second terminal of the fourth Josephson junction coupled to the first terminal of the first Josephson junction, such that the fourth Josephson junction is interposed between the second terminal of the drive resistance and the first terminal of the third Josephson junction;

(b) a third inductance having a first and second terminal, the first terminal of the third inductance coupled to the first terminal of the fourth Josephson junction and the second terminal of the third inductance coupled to the reference potential;

(c) a fourth inductance having a first and second terminal, the first terminal coupled to the second terminal of the fourth Josephson junction; and (d) a fifth Josephson junction having a first and second terminal, the first terminal of the fifth Josephson junction coupled to the second terminal of the fourth inductance and the second terminal of the fifth Josephson junction coupled to the reference potential.

13. The digital logic circuit of claim 12, wherein the driver circuit further comprises:

(a) a first current source having a current in port and a current out port, the current in port of the first current source coupled to a reference potential, the current out port of the first current source coupled to the first terminal of the first Josephson junction; and (b) a second current source having a current in port and a current out port, the current in port of the second current source coupled to a reference potential, the current out port of the second current source coupled to the first terminal of the second Josephson junction; and wherein the receiver further comprises:

(a) a third current source having a current in port and a current out port, the current in port of the third current source coupled to a reference potential, the current out port of the third current source coupled to the first terminal of the third Josephson junction; and (b) a fourth current source having a current in port and a current out port, the current in port coupled to the reference potential and the current out port coupled to the second terminal of the fourth inductance.

14. The digital logic circuit of claim 13, wherein the drive resistance and the PTL have an impedance of 16 Ohms.

* * * * *